(12) United States Patent
Starr et al.

(10) Patent No.: US 6,803,803 B1
(45) Date of Patent: Oct. 12, 2004

(54) METHOD AND APPARATUS FOR COMPENSATING CIRCUITS FOR VARIATIONS IN TEMPERATURE SUPPLY AND PROCESS

(75) Inventors: Greg Starr, San Jose, CA (US); Kang Wei Lai, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/206,415

(22) Filed: Jul. 26, 2002

Related U.S. Application Data
(60) Provisional application No. 60/310,135, filed on Aug. 3, 2001.

(51) Int. Cl.$^7$ ............................................... H03K 17/14
(52) U.S. Cl. ......................... 327/378; 327/513; 330/289
(58) Field of Search ................................ 327/378, 262, 327/339, 355, 362, 513, 535, 538–543; 330/289

(56) References Cited

U.S. PATENT DOCUMENTS

| | | | |
|---|---|---|---|
| 4,477,737 A | * 10/1984 | Ulmer et al. | ............... 327/541 |
| 5,021,684 A | * 6/1991 | Ahuja et al. | ................... 326/27 |
| 5,578,945 A | 11/1996 | Flora | ............................. 326/93 |
| 5,994,945 A | * 11/1999 | Wu et al. | .................... 327/378 |
| 6,127,865 A | 10/2000 | Jefferson | .................... 327/149 |
| 6,163,195 A | 12/2000 | Jefferson | .................... 327/262 |
| 2002/0057121 A1 | 5/2002 | Lee | |

* cited by examiner

*Primary Examiner*—Minh Nguyen
(74) *Attorney, Agent, or Firm*—Morrison & Foerster LLP (57) ABSTRACT

An exemplary compensation circuit includes: a temperature compensation circuit which provides as an output a temperature compensation signal indicative of temperature variations; a supply compensation circuit which provides as an output a supply compensation signal indicative of supply voltage variations; and a compensation conversion circuit coupled to the temperature compensation circuit and the supply compensation circuit to provide as an output a bias signal from the temperature compensation signal and the supply compensation signal. The supply compensation circuit includes a voltage divider circuit coupled to a supply compensation node, to a source voltage, and to a sink voltage, where the supply compensation node is coupled to an input of the compensation conversion circuit. The source voltage provides a supply voltage, and the supply compensation signal is indicative of variations in the supply voltage.

83 Claims, 5 Drawing Sheets

METHOD AND APPARATUS FOR COMPENSATING CIRCUITS FOR VARIATIONS IN TEMPERATURE SUPPLY AND PROCESS

BACKGROUND OF THE INVENTION

1. Field of the Invention

This invention relates generally to the electronic arts and more particularly to compensation circuits for counteracting the effects of variations in process, temperature and supply voltage, particularly in the context of delay circuits.

2. Description of Related Art

Delay circuits are known in the art. In many applications, it is useful to be able to apply a prescribed delay to a signal's propagation time (i.e. increase the propagation time) between two or more locations in an integrated circuit, or phase shift one signal relative to another signal. One such example is the need to compensate for delays in the distribution of clock signals and/or the delay in propagation of logic signals (see U.S. Pat. No. 6,127,865).

Another example of the use of delay circuits is to provide a prescribed delay to a data signal in order to compensate for a data signal path that is shorter than a clock signal path (see U.S. Pat. No. 6,163,195).

Figure 1A:
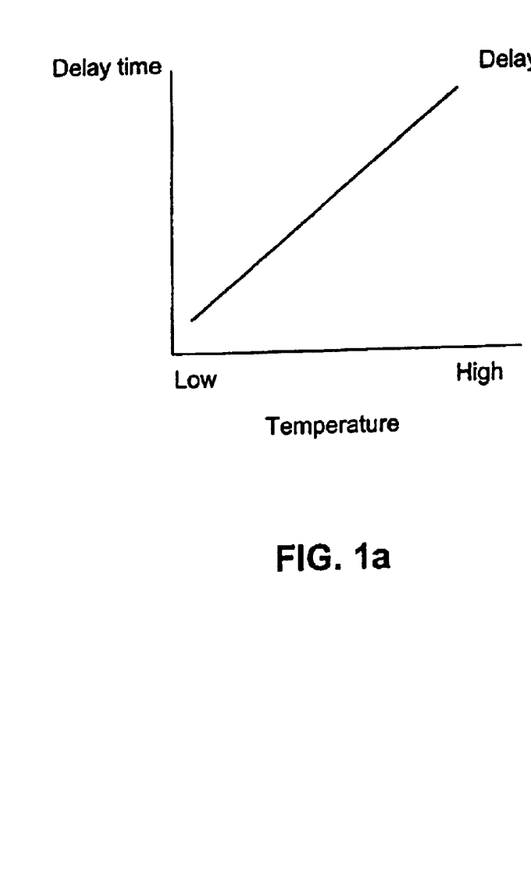
FIG. 1a is a generalized graph showing the relationship between delay time and temperature.

As signaling speed and integrated circuit density and complexity increase, there is an increasing need to provide more precisely prescribed delay times. One set of problems in implementing delay circuits that deliver precisely prescribed delay times have to do with the effect of variations in temperature, voltage supply, and process on the delay time provided by the delay element. These effects require further explanation. Each can affect current flow which in turn affects delay times. For example, as temperature increases, current flow decreases (as materials become more resistive) and delay time increases. This relationship between temperature and delay is illustrated in FIG. 1a.

Figures 1B, 1C:
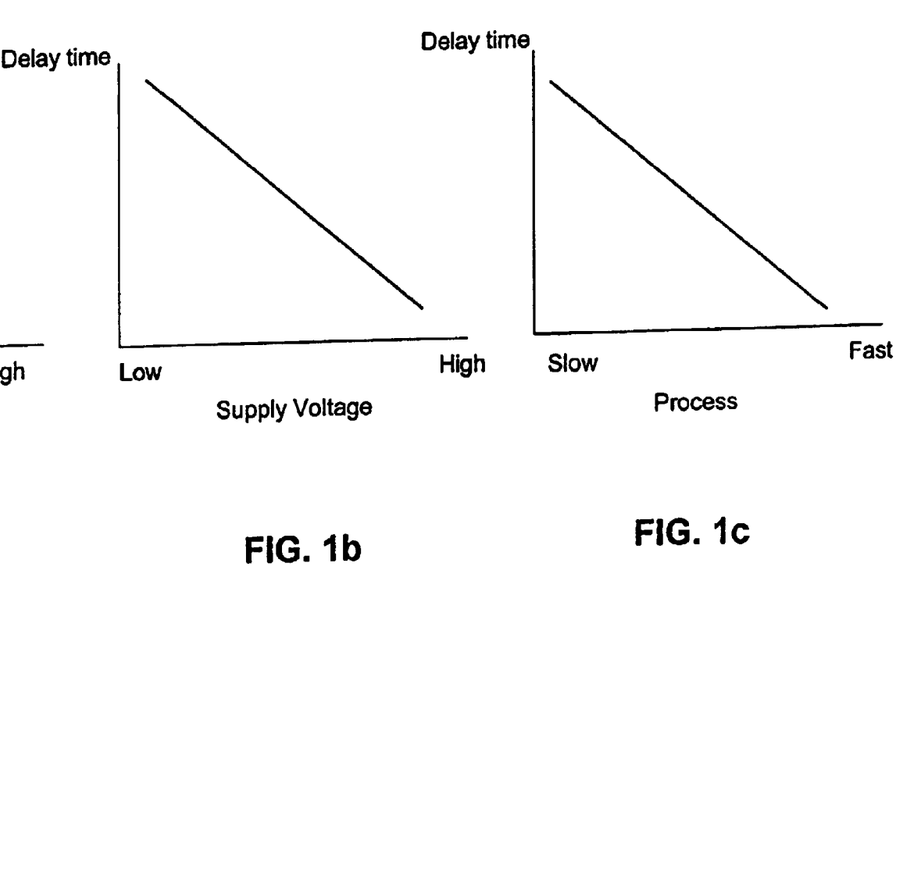
FIG. 1b is a generalized graph showing the relationship between delay time and supply voltage.
FIG. 1c is a generalized graph showing the relationship between process effects that cause elements to run either slow or fast, and delay time.

Supply voltage levels also affect current and therefore delay time. As supply voltage increases, current flow also increases and delay time decreases. This relationship between supply voltage and delay is shown in FIG. 1b. Effects due to supply voltage are sometimes referred to herein as simply "supply effects", "effects due to supply," or like phrases.

The variations in parameters of the fabrication and finishing process used to deliver an integrated circuit (IC) chip may also affect delay. These effects may cause actual delay to differ from the calculated or intended delay were the design specifications met perfectly. For example, across a wafer, inconsistencies in device elements may cause departures between actual and designed delay. Such inconsistencies could be from uneven polishing, temperature gradients, etc. resulting in device variations across a wafer. This may also relate to wafers being manufactured at different points in time, or at different locations within the processing machine. For example, a diffusion furnace may be set at 500.0 C one day, and the next 500.1 C the next. Each temperature will give slightly different device performances. Temperature differences may also exists simultaneously in different portions of the furnace. These various effects will sometimes be referred to herein as "process effects", "effects due to process", and like phrases.

FIG. 1c illustrates that different process parameters can result in different delays. For the sake of illustration, process effects that cause elements to run "slow" are shown to be associated with resulting high delay times and process effects that cause elements to run "fast" are shown to be associated with resulting low delay times.

Those skilled in the art will appreciate that FIGS. 1a, 1b, and 1c are very general illustrations meant only to show over all relationships between temperature/supply/process on the one hand, and delay on the other.

Some attempts have been made to correct for the effects that temperature, supply, and process have on signals. For example, in the context of generating and distributing clock signals, it is known to insert into the feedback of a PLL (phase lock loop) delay circuitry that maps the actual clock distribution network in order to generate a phase shifted clock signal that tracks the effects that variations in temperature, supply, and process have on the delay of a reference clock signal distributed through the clock signal network. (See U.S. Pat. No. 6,127,865, col. 1, lines 41–57).

However, a drawback of relying solely on PLL circuits to track temperature, supply, and process is that PLL circuits are complex and require many elements. Another approach is to use a delay chain with a bias circuit that provides a bias voltage to control current through the delay chain and to vary the bias voltage (and hence vary a bias current) to compensate for factors whose variation affects delay times. With respect to the effect of temperature, such an approach has been disclosed in U.S. Pat. No. 6,163,195. That patent teaches the use of a bias circuit that adjusts a bias voltage applied to a delay chain in response to changes in temperature thereby helping compensate for temperature effects on a delay provided by the delay chain.

However, a delay circuit is still needed that includes a compensating bias circuit that compensates for effects in addition to temperature. In particular, a delay circuit is needed that includes a bias circuit that compensates for the effects of variations in temperature, supply, and process.

SUMMARY OF THE INVENTION

The present invention provides a compensating bias circuit connected to drive a bias current that compensates for the effects that variations in temperature, supply, and process have on a delay time of a delay circuit. By providing compensation for factors that include temperature, process, and supply, the present invention addresses the need for a delay circuit having a compensating bias circuit for providing more consistent delays across a variety of conditions.

BRIEF DESCRIPTION OF THE DRAWINGS

The novel features of the invention are set forth in the appended claims. However, for purpose of explanation, several aspects of a particular embodiment of the invention and of an alternative embodiment of the invention are described by reference to the following figures.

DETAILED DESCRIPTION OF THE PREFERRED EMBODIMENTS

The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

A delay circuit embodying the present invention may be provided as part of an electronic system. Part or all of such an electronic system may be implemented on an integrated circuit chip. One example of the context in which the present delay circuit might be utilized is as part of a programmable logic device. Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to not necessarily exclude such devices.

In a particular embodiment, a delay circuit comprises a CMOS inverter chain connected to source and sink circuits and a bias circuit that provides a bias voltage to the source and sink circuits, the bias voltage varying with changes in temperature, supply, and process in a manner that compensates for the effect those changes would otherwise have on a delay time provided by the delay circuit. In as aspect of this embodiment, the compensation bias circuit comprises respective compensating circuits including a supply compensating circuit, a temperature compensating circuit, and a process compensating circuit that each provide a node voltage. The bias circuit also includes a compensation conversion circuit connected to provide an output voltage dependent upon each node voltage provided by the respective compensating circuits. The output voltage of the compensation conversion circuit drives the bias voltage provided by the bias circuit.

Figure 2:
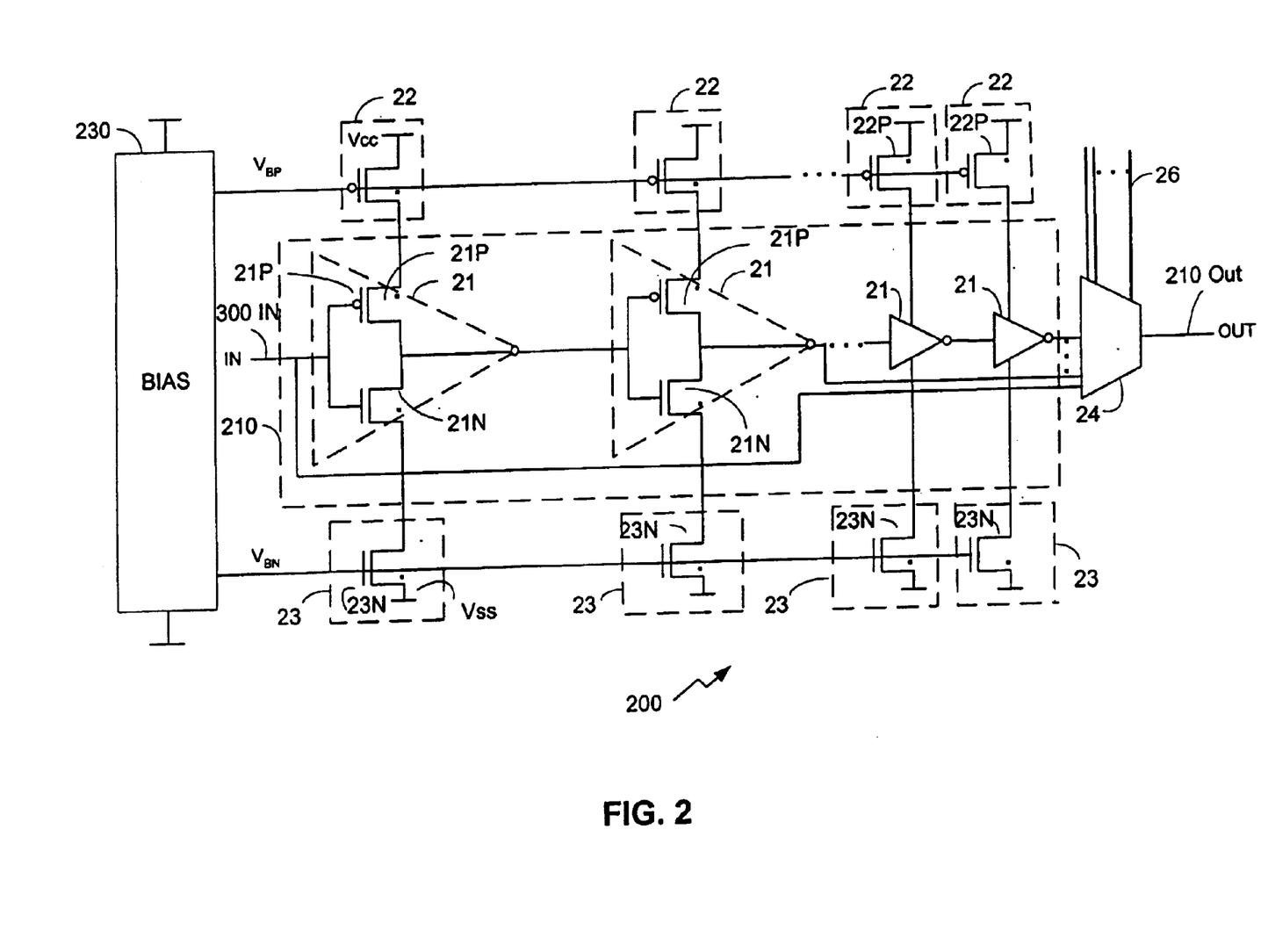
FIG. 2 is a diagram of a delay circuit in accordance with a present embodiment of the invention.

FIG. 2 shows a delay circuit 200 comprising bias 230, delay element chain 210, current supply circuits including current sources 22 and current sinks 23, and multiplexer ("mux") 24. Delay chain 210 comprises delay elements 21. Current sources 22 each comprise a PMOS current source transistor 22P and a connection to a supply voltage providing a source voltage $V_{CC}$. Connections to the source voltage are indicated by the T symbol. Current sinks 23 each comprise an NMOS current sink transistor 23N and connections to a voltage sink providing a sink voltage $V_{SS}$. Connections to the voltage sink are indicated by the ⊥ symbol. In the present embodiment, $V_{SS}$ is obtained simply by connecting to ground. However, in alternative embodiments, $V_{SS}$ might be other voltages less than $V_{CC}$. For example, $V_{SS}$ might be obtained inverting voltage $V_{CC}$ from the voltage source to provide sink voltage $V_{SS}$ ($V_{SS}$ sometimes being referred to as a "negative supply" voltage as it may in some contexts be derived from the supply voltage). However, as stated, in the present embodiment, the sink voltage is obtained by connecting to ground.

Delay elements 21 are inverters each comprising a PMOS transistor 21P and an NMOS transistor 21N. The output of each delay element 21 (with the exception of the last delay element 21 in the delay chain) is connected to the input of the next delay element 21. The output of every other one of the delay elements 21 is also connected to mux 24. By connecting selected delay elements 21 to mux 24, the amount of delay provided by delay chain 210 may be programmed. Mux control lines 26 receive a signal indicating which of the plurality of connections to mux 24 should be connected for output at output 200OUT. In this manner the length of the delay chain through which a signal (e.g. a clock signal or a data signal, or other signal) presented at input 200IN travels may be programmably selected, thereby allowing the amount of delay time imparted to such a signal to be programmed.

Delay element inverters 21 function in the following manner: When a voltage at an input of a delay element 21 is low, the PMOS transistor 21P of the delay element is on and will draw current from the current source 22 to which it is connected. The NMOS transistor 21N of the delay element 21 will be off. Therefore, the current flow from current source 22 through transistor 21N will drive a voltage at the output of the delay element 21 high. This high voltage will be provided to the input of the next delay element 21 in delay chain 210. When a voltage at an input of a delay element 21 is high, the PMOS transistor 21P of the delay element will be off. The NMOS transistor 21N of the delay element 21 will be on and current will flow through transistor 21N to current sink 23. This current flow to current sink 32 pulls the voltage at the output of that delay element 21 low.

Because delay elements 21 are inverters, passing a signal through two delay elements inverts and then un-inverts the signal. Thus, a delay chain such as delay chain 210 will typically comprise an even number of inverter elements.

The speed at which a signal passes through all or portions of delay chain 210 depends at least in part upon the amount of current flowing through transistors 22P, 21P, 21N, and 23N. The greater the current flow through transistors that are on, the greater the speed of the signal passing through the delay chain, and therefore the smaller the delay that will be imparted by a given number of delay elements 21. PMOS current source transistors 22P are maintained on by a low bias source voltage $V_{BP}$ delivered to the transistor gate from bias current 230. NMOS current sink transistors 23N are maintained on by a high bias voltage $V_{BN}$ delivered to the transistor gate from bias circuit 230.

As discussed in relation to FIG. 1, delay time will be affected by variations in temperature, supply voltage (including sink voltage, which in the present embodiment is derived from supply voltage), and process. Delay time is also affected by the bias voltages applied to transistors 23N and 22P.

In delay circuit 200, bias current 230 adjusts the bias voltage comprising bias voltages $V_{BP}$ and $V_{BN}$ to compensate for variations in current flow due to variations in temperature, supply, and process. For example, when temperature increases, bias circuit 230 decreases bias voltage $V_{BP}$ and increases bias voltage $V_{BN}$ to increase the current flow through, respectively, source transistors 22P (more flow at lower bias voltage—lower bias voltage increases gate-to-source voltage of transistors 22P) and sink transistors 23N (higher gate-to-source voltage and more flow at higher bias voltage) despite the effects of increased temperature (which would ordinarily cause a decrease in the current flow). Similarly, when supply voltage increases, bias circuit 230 increases bias voltage $V_{BP}$ and decreases bias voltage $V_{BN}$ to retard current flow through, respectively, source transistors 22P (less flow at higher bias voltage) and sink transistors 23N (less flow at lower bias voltage) thus maintaining substantially constant delay time despite the effects of increased supply voltage (which would ordinarily cause an increased current flow).

Figure 3A:
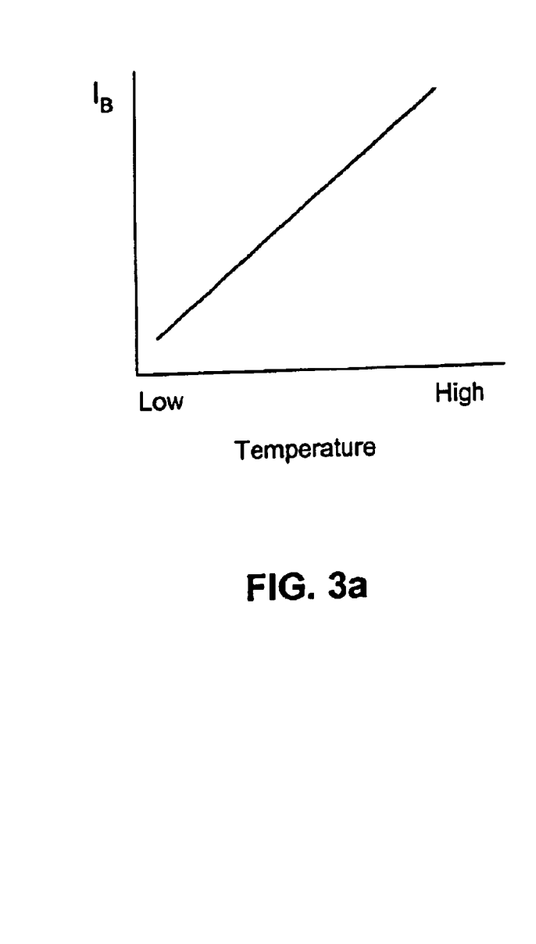
FIG. 3a is a generalized graph showing the relationship between a compensating bias current and temperature variations.
Figure 3B:
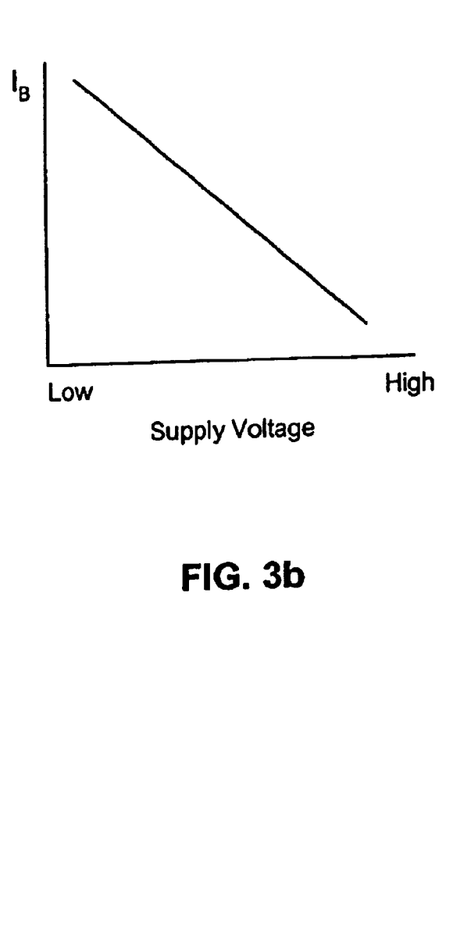
FIG. 3b is a generalized graph showing the relationship between a compensating bias current and supply variations.
Figure 3C:
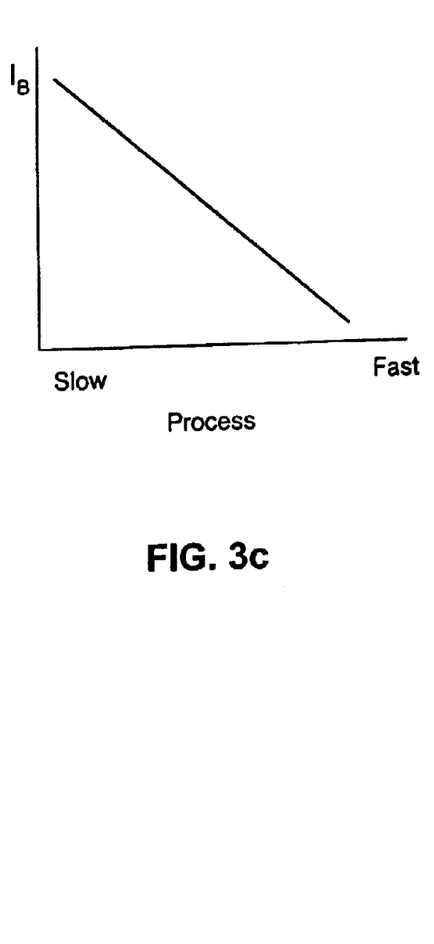
FIG. 3c is a generalized graph showing the relationship between a compensating bias current and process variations.

FIGS. 3a, 3b, and 3c illustrates the relationship between bias current and variations in temperature, supply, and process. When the temperature, supply, or process variations would normally speed up the device, bias circuit 230 delivers voltages to current sources 22 and current sinks 23 that bias the source and sink current to compensate for those variations in temperature, supply, or process. Specifically, as shown in FIG. 3a, an increase in temperature that wold ordinarily lead to a decrease in current (and hence more delay), is counterbalanced by an increase in bias current $I_B$. A decrease in temperature that would ordinarily lead to an increase in current (and hence less delay), is counterbalanced by a decrease in bias current $I_B$. As shown in FIG. 3b, an increase in supply voltage that would ordinarily lead to an increase in current (and hence less delay), is counterbalanced by a decrease in bias current $I_B$. A decrease in supply voltage that would ordinarily lead to a decrease in current (and hence more delay), is counterbalanced by an increase in bias current $I_B$. Specifically, as shown in FIG. 3c, process variations that would normally lead to high current (and hence less delay), are counterbalanced by an decrease in bias current $I_B$. Process variation that would normally lead to low current (and hence more delay), are counterbalanced by an increase in bias current $I_B$.

Figure 4:
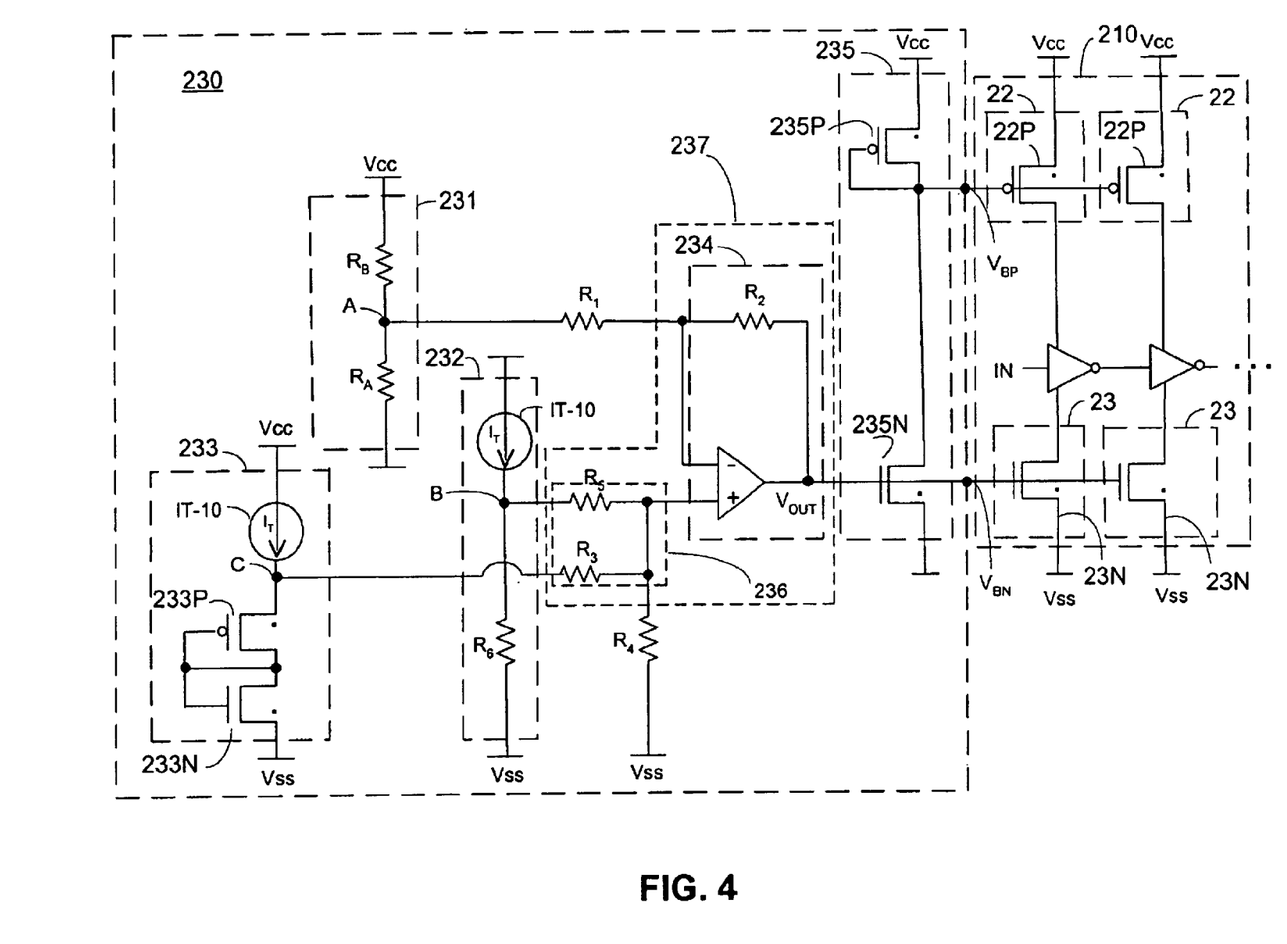
FIG. 4 is a detailed diagram of the compensating bias circuit of the embodiment shown in FIG. 2.

FIG. 4 is a detailed view of compensation bias current 230 of delay circuit 200 of FIG. 2. Bias circuit 230 includes supply compensation circuit 231, temperature compensation circuit 232, and process compensation circuit 233. Bias circuit 230 further includes compensation conversion circuit 237, which in turn includes summing input circuit 236 (including resistors $R_3$ and $R_5$) and operational amplifier circuit 234 (including op-amp feedback resistor $R_2$). Bias circuit 230 also includes interface circuit 235 (a current mirror circuit in the present embodiment), and resistors $R_1$ and $R_4$. Connections to source voltage $V_{CC}$ are indicated by the T symbol. Connections to the sink voltage $V_{SS}$ are indicated by the $\perp$ symbol.

Supply compensation circuit 231 comprises resistors $R_B$ and $R_A$ connected as a voltage divider coupled to supply compensation node A. Node A is coupled to compensation conversion circuit 237 at the inverting input of op-amp circuit 234 through resistor $R_1$. Temperature compensation circuit 232 includes a standard PTAT (proportional to ambient temperature) current supply IT-10 and resistor $R_6$, coupled as shown. Temperature compensation circuit 232 is coupled to temperature compensation node B. Node B is coupled to an input of summing input circuit 236 of compensation conversion circuit 237. Process compensation circuit 233 includes PTAT current supply IT-10 and gate-to-drain-coupled transistors 233P and 233N, coupled as shown forming a diode circuit. Process compensation circuit 233 is coupled to process compensation node C. Node C is coupled to another input of summing input circuit 236. Summing input circuit 236 is coupled to the non-inverting input of op-amp 234.

A voltage $V_{OUT}$ at the output of op-amp 234 drives the bias voltage comprising source bias $V_{BP}$ and sink bias $V_{BN}$. Current mirror 235 allows the voltage $V_{OUT}$ at the output of op-amp 234 to drive both the high sink bias voltage $V_{BN}$ and the low source bias voltage $V_{BP}$. In the present embodiment, the output of op-amp 234 is coupled directly to the gate of each respective sink transistor 23N as well as being coupled to the gate of NMOS current mirror transistor 235N. Thus, when $V_{OUT}$ increases, $V_{BN}$ also increases, thereby increasing a bias current through sink transistors 23N. Also when $V_{OUT}$ increases, $V_{BP}$ decreases as current flow through NMOS current mirror transistor 235N and PMOS current mirror transistor 235P increases. Thus, an increase in $V_{OUT}$ decreases $V_{BP}$ which increases a bias current through source transistors 22P. When $V_{OUT}$ decreases, $V_{BN}$ decreases, thereby decreasing a bias current through sink transistors 23N. Also when $V_{OUT}$ decreases, $V_{BP}$ increases, thereby decreasing a bias current through source transistors 22P.

The following equations apply to the bias circuit of FIG. 4 ($V_A$, $V_B$, and $V_C$ are the voltages at, respectively, supply compensation node A, temperature compensation node B, and process compensation node C and $V_{OUT}$ is the voltage at the output of op-amp circuit 234):

$$V_{OUT} = -\frac{R_2}{R_1}V_A + \left(\frac{V_B}{R_3} + \frac{V_C}{R_5}\right)\left(\frac{R_3 R_4 R_5}{R_3 R_4 + R_4 R_5 + R_3 R_5}\right)\left(\frac{R_1 + R_2}{R_1}\right) \quad (1)$$

$$V_A \cong \left[\frac{R_A}{R_A + R_B}\right] V_{CC} \quad (2)$$

$$V_B \cong \left[\frac{R_C}{R_7}\right] V_T \ln(M) \quad (3)$$

$$V_C \cong V_{tp} + V_{tn} + \sqrt{\frac{2I_T}{K_p}} + \sqrt{\frac{2I_T}{K_n}} \quad (4)$$

Figure 5:
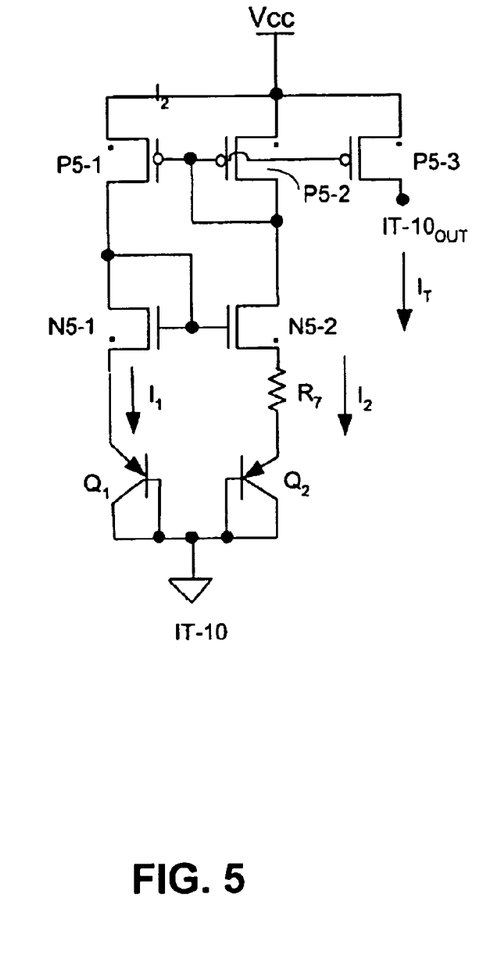
FIG. 5 is a detailed diagram of the proportional to ambient temperature (PTAT) current supply circuit of the bias circuit shown in FIG. 4.

Vtp and Vtn are the threshold voltages for, respectively, transistor 233P and 233N. Kp and Kn are device parameter constants for, respectively, transistor 233P and 233N. M is a constant determined by transistor ratios of transistors in PTAT current supply IT-10. $V_T$ is thermal voltage given by $V_T = kT$ where k is Boltzman's constant and T is temperature. $R_7$ is the resistance of resistor $R_7$ shown the FIG. 5's detailed diagram of PTAT currently supply IT-10. $I_T$ is the current through standard PTAT current supply IT-10 given by the following equation:

$$I_T = \frac{V_T \ln(M)}{R_7} \quad (5)$$

From the above equation (1), it is seen that $V_{OUT}$ increases with increases in $V_B$ and/or $V_C$ and $V_{OUT}$ decreases with increases in $V_A$. From above equation (2) it is seen that $V_A$ is dependent at least in part on Vcc and thus is dependent on variations in supply voltage. From above equations (3) it is seen that $V_B$ is dependent at least in part on thermal voltages thus is dependent on variations in temperature. From above equation (4) it is seen that $V_C$ is dependent at least in part on device parameters (e.g. threshold voltages, device parameter constants), and thus is dependent on variations due to process effects. Because $V_{OUT}$ drives the bias voltage, the bias circuit 230 compensates for variations in current due to variations in process, supply, and temperature.

Those skilled in the art will appreciate that to say that the bias voltage "compensates" for the effects of process, supply, and/or temperature does not require that those effects be eliminated entirely. Rather, it means that the bias voltage varies in a manner that has some counterbalancing effect without which the effects of process, supply, and/or temperature variations would otherwise have a greater impact upon a delay of the delay circuit. For example, when supply voltage increases, the tendency of the delay circuit is to run faster, thereby diminishing the delay. However, the inventive bias circuit compensates for this. As Vcc increases, $V_A$ also increases, but $V_{OUT}$ therefore decreases and thus drives the bias voltage to provide a lower gate voltage to NMOS sink transistors 23N and a higher gate voltage to PMOS source transistors 22P, which in turn has a retarding effect on current through the delay elements, thereby having an augmenting effect on delay to at least partially counterbalance the diminishing effect that a Vcc increase would otherwise have on a delay of the delay circuit.

Those skilled in the art will further appreciate that the particular relationship between the voltage at the output of the disclosed op-amp and the bias voltage including the source bias voltage and sink bias voltage is particularly adapted to CMOS technology including delay elements comprising complementary PMOS and NMOS inverters. Those skilled in the art will also appreciate that variations on the disclosed circuit may provide the same or similar relationships between node voltages and the effects of temperature, supply, and/or process and between those node voltages and a voltage driving a compensating bias voltage. In that regard, it will be appreciated that alternative embodiments in which a compensating bias voltage is driven by (or is itself) a voltage that varies in response to variations in process, temperature, and/or supply and such voltage variation compensates for (i.e. has at least some counterbalancing effect on) delay variations caused by variations in temperature, supply, and/or process would not necessarily depart from the spirit and scope of the present invention.

FIG. 5 is a detailed view of the PTAT circuit IT-10 of FIG. 4. PTAT current supply IT-10 comprises PMOS transistors P5-1, P5-2, and P5-3; NMOS transistors N5-1 and N5-2; bipolar junction transistors Q1 and Q2; and resistors $R_7$, all elements connected as shown, and providing current $I_T$ to bias circuit 230 at IT-10OUT. Current $I_T$ is driven based on difference between $I_1$ and $I_2$ which in turn depends upon the thermal voltage and on the resistance of resistor $R_7$, both the thermal voltage and the resistance of resistor $R_7$ being dependent upon temperature. Thus, circuit IT-10 shows one example of a PTAT current supply, i.e. a circuit that provides a current supply that is proportional to ambient temperature. Although alternative embodiments could achieve process compensation without a PTAT current supply, use of the PTAT current supply had the added benefit of being used to promote temperature compensation; furthermore, the PTAT current source used by process compensation circuit 231 may be shared by temperature compensation circuit 232 and process compensation circuit 231. Also, those skilled in the art will recognize that PTAT circuit IT-10 illustrated in FIG. 5 shows one example of a PTAT circuit and other PTAT circuits may be used without necessarily departing from the spirit and scope of the present invention.

Although particular embodiments have been described in detail, various modifications to the embodiments described herein may be made without departing from the spirit and scope of the present invention, thus, the invention is limited only by the appended claims.

We claim:

1. A compensation circuit comprising:
   a temperature compensation circuit which provides as an output a temperature compensation signal indicative of temperature variations;
   a supply compensation circuit which provides as an output a supply compensation signal indicative of supply voltage variations; and
   a compensation conversion circuit coupled to the temperature compensation circuit and the supply compensation circuit to provide as an output a bias signal from the temperature compensation signal and the supply compensation signal, wherein
   the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to an input of the compensation conversion circuit.

2. The compensation circuit of claim 1 further comprising:
   an interface circuit coupled to the compensation conversion circuit to receive the bias signal as input and to provide as an output at least one bias signal.

3. The compensation circuit of claim 2 wherein the at least one bias signal provided by the interface circuit includes at least two bias signals including a PMOS bias signal and an NMOS bias signal.

4. The compensation circuit of claim 2 wherein the interface circuit connects to a current mirror circuit.

5. The compensation circuit of claim 1 wherein the compensation conversion circuit includes an operational amplifier circuit.

6. The compensation circuit of claim 1 wherein the temperature compensation circuit comprises:
   a current source coupled to a voltage source and a temperature compensation node; and
   a resistor coupled to a voltage sink and the temperature compensation node, the temperature compensation node being coupled to an input of the compensation conversion circuit.

7. The compensation circuit of claim 6 wherein the current source is proportional to ambient temperature (PTAT) current source.

8. A compensation circuit comprising:
   a temperature compensation circuit which provides as an output a temperature compensation signal indicative of temperature variations;
   a supply compensation circuit which provides as an output a supply compensation signal indicative of supply voltage variations; and
   a compensation conversion circuit coupled to the temperature compensation circuit and the supply compensation circuit to provide as an output a bias signal from the temperature compensation signal and the supply compensation signal, wherein
   the temperature compensation circuit comprises a current source coupled to a voltage source and a temperature compensation node, and a resistor coupled to a voltage sink and the temperature compensation node, the temperature compensation node being coupled to an input of the compensation conversion circuit; and the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the compensation conversion circuit and the temperature compensation node being coupled to a second input of the compensation conversion circuit.

9. The compensation circuit of claim 8 wherein the compensation conversion circuit comprises an operational amplifier circuit having a first input and a second input;

the supply compensation node being coupled to the first input of the operational amplifier circuit and the temperature compensation node being coupled to the second input of the operational amplifier circuit.

10. The compensation circuit of claim 9 wherein the first input of the operational amplifier circuit is an inverting input and the second input of the operational amplifier circuit is a non-inverting input.

11. A programmable logic device including a compensation circuit, the compensation circuit comprising:

a temperature compensation circuit which provides as an output a temperature compensation signal indicative of temperature variations;

a supply compensation circuit which provides as an output a supply compensation signal indicative of supply voltage variations; and a compensation conversion circuit coupled to the temperature compensation circuit and the supply compensation circuit to provide as an output a bias signal from the temperature compensation signal and the supply compensation signal, wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to an input of the compensation conversion circuit.

12. The programmable logic device of claim 11, wherein the compensation circuit further comprises:

an interface circuit coupled to the compensation conversion circuit to receive the bias signal as an input and to provide as an output at least one bias signal.

13. The programmable logic device of claim 12, wherein the at least one bias signal provided by the interface circuit includes at least two bias signals including a PMOS bias signal and an NMOS bias signal.

14. A programmable logic device including a compensation circuit, the compensation circuit comprising:

a temperature compensation circuit which provides as an output a temperature compensation signal indicative of temperature variations;

a supply compensation circuit which provides as an output a supply compensation signal indicative of supply voltage variations; and a compensation conversion circuit coupled to the temperature compensation circuit and the supply compensation circuit to provide as an output a bias signal from the temperature compensation signal and the supply compensation signal, wherein the supply compensation circuit comprises a current source coupled to a voltage source and a temperature compensation node, and a resistor coupled to a voltage sink and the temperature compensation node, the temperature compensation node being coupled to an input of the compensation conversion circuit; and the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the compensation conversion circuit and the temperature compensation node being coupled to a second input of the compensation conversion circuit.

15. A compensation circuit comprising:

a process compensation circuit which provides as an output a process compensation signal indicative of process variations;

a supply compensation circuit which provides as an output a supply compensation signal indicative of supply voltage variations; and a compensation conversion circuit coupled to the process compensation circuit and the supply compensation circuit to provide as an output a bias signal from the process compensation signal and the supply compensation signal, wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to an input of the compensation conversion circuit.

16. The compensation circuit of claim 15 further comprising:

an interface circuit coupled to the compensation conversion circuit to receive the bias signal as in input and to provide as an output at least one bias signal.

17. The compensation circuit of claim 16 wherein the at least one bias signal provided by the interface circuit includes at least two bias signals including a PMOS bias signal and an NMOS bias signal.

18. The compensation circuit of claim 16 wherein the interface circuit connects to a current mirror circuit.

19. The compensation circuit of claim 15 wherein the compensation conversion circuit includes an operational amplifier circuit.

20. The compensation circuit of claim 15 wherein the process compensation circuit comprises:

a current source coupled to a voltage source and a process compensation node; and a diode circuit comprising at least one gate-to-drain-coupled transistor of a transistor type or types corresponding to transistors in a circuit for which the compensation circuit is compensating, the diode circuit being coupled to a voltage sink and to the process compensation node, the process compensation node being coupled to an input of the compensation conversion circuit.

21. The compensation circuit of claim 20 wherein the at least one gate-to-drain-coupled transistor of the process compensation circuit includes CMOS transistors including a PMOS transistor and an NMOS transistor.

22. The compensation circuit of claim 20 wherein the current source is a proportional to ambient temperature (PTAT) current source.

23. A compensation circuit comprising:
a process compensation circuit which provides as an output a process compensation signal indicative of process variations;
a supply compensation circuit which provides as an output a supply compensation signal indicative of supply voltage variations; and
a compensation conversion circuit coupled to the process compensation circuit and the supply compensation circuit to provide as an output a bias signal from the process compensation signal and the supply compensation signal, wherein
the process compensation circuit comprises a current source coupled to a voltage source and a process compensation node, and a diode circuit comprising at least one gate-to-drain-coupled transistor of a transistor type or types corresponding to transistors in a circuit for which the compensation circuit is compensating, the diode circuit being coupled to a voltage sink and to the process compensation node, the process compensation node being coupled to an input of the compensation conversion circuit; and
the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the compensation conversion circuit and the temperature compensation node being coupled to a second input of the compensation conversion circuit.

24. The compensation circuit of claim 23 wherein the compensation conversion circuit comprises an operational amplifier circuit having a first input and a second input, the supply compensation node being coupled to the first input and the process compensation node being coupled to the second input.

25. The compensation circuit of claim 24 wherein the first input is an inverting input and the second input is a non-inverting input.

26. A programmable logic device including a compensation circuit, the compensation circuit comprising:
a process compensation circuit which provides as an output a process compensation signal indicative of process variations;
a supply compensation circuit which provides as an output a supply compensation signal indicative of supply voltage variations; and
a compensation conversion circuit coupled to the process compensation circuit and the supply compensation circuit to provide as an output a bias signal from the process compensation signal and the supply compensation signal, wherein
the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to an input of the compensation conversion circuit.

27. The programmable logic device of claim 26, wherein the compensation circuit further comprises:
an interface circuit coupled to the compensation conversion circuit to receive the bias signal as in input and to provide as an output at least one bias signal.

28. The programmable logic device of claim 27, wherein the at least one bias signal provided by the interface circuit includes at least two bias signals including a PMOS bias signal and an NMOS bias signal.

29. A programmable logic device including a compensation circuit, the compensation circuit comprising:
a process compensation circuit which provides as an output a process compensation signal indicative of process variations;
a supply compensation circuit which provides as an output a supply compensation signal indicative of supply voltage variations; and
a compensation conversion circuit coupled to the process compensation circuit and the supply compensation circuit to provide as an output a bias signal from the process compensation signal and the supply compensation signal, wherein
the process compensation circuit comprises a current source coupled to a voltage source and a process compensation node, and a diode circuit comprising at least one gate-to-drain-coupled transistor of a transistor type or types corresponding to transistors in a circuit for which the compensation circuit is compensating, the diode circuit being coupled to a voltage sink and to the process compensation node, the process compensation node being coupled to an input of the compensation conversion circuit; and
the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the compensation conversion circuit and the temperature compensation node being coupled to a second input of the compensation conversion circuit.

30. A compensation circuit comprising:
a temperature compensation circuit which provides as an output a temperature compensation signal indicative of temperature variations;
a process compensation circuit which provides as an output a process compensation signal indicative of process variations;
a compensation conversion circuit coupled to the temperature compensation circuit and the process compensation circuit to provide as an output a bias signal from the process compensation signal and the supply compensation signal, wherein
the compensation conversion circuit comprises an operational amplifier circuit and a summing input circuit coupled to an input of the operational amplifier circuit, a first input of the summing input circuit being coupled to the temperature compensation circuit and a second input of the summing input circuit being coupled to the process compensation circuit.

31. The compensation circuit of claim 30 further comprising:
an interface circuit coupled to the compensation conversion circuit to receive the bias signal as an input and to provide as an output at least one bias signal.

32. The compensation circuit of claim 31 wherein the at least one bias signal provided by the interface circuit includes at least two bias signals including a PMOS bias signal and an NMOS bias signal.

33. The compensation circuit of claim 31 wherein the interface circuit connects to a current mirror circuit.

34. The compensation circuit of claim 34 wherein the temperature compensation circuit comprises:
   a current source coupled to a voltage source and a temperature compensation node; and
   a resistor coupled to a voltage sink and the temperature compensation node, the temperature compensation node being coupled to an input of the compensation conversion circuit.

35. The compensation circuit of claim 34 wherein the current source is proportional to ambient temperature (PTAT) current source.

36. The compensation circuit of claim 34 wherein the process compensation circuit comprises:
   a current source coupled to a voltage source and a processor compensation node; and
   a diode circuit comprising at least one gate-to-drain-coupled transistor of a transistor type or types corresponding to transistors in a circuit for which the compensation circuit is compensating, the diode circuit being coupled to a voltage sink and to the process compensation node.

37. The compensation circuit of claim 30 wherein the process compensation circuit comprises:
   a current source coupled to a voltage source and a process compensation node; and
   a diode circuit comprising at least one gate-to-drain-coupled transistor of a transistor type or types corresponding to transistors in a circuit for which the compensation circuit is compensating the diode circuit being coupled to a voltage sink and to the process compensation node, the process compensation node being coupled to an input of the compensation conversion circuit.

38. The compensation circuit of claim 37 wherein the at least one gate-to-drain coupled transistor of the process compensation circuit includes CMOS transistors including a PMOS transistor and an NMOS transistor.

39. The compensation circuit of claim 37 wherein the current source is a proportional to ambient temperature (PTAT) current source.

40. A programmable logic device including a compensation circuit, the compensation circuit comprising:
   a temperature compensation circuit which provides as an output a temperature compensation signal indicative of temperature variations;
   a process compensation circuit which provides as an output a process compensation signal indicative of process variations;
   a compensation conversion circuit coupled to the temperature compensation circuit and the process compensation circuit to provide as an output a bias signal from the process compensation signal and the supply compensation signal, wherein
   the compensation conversion circuit comprises an operational amplifier circuit and a summing input circuit coupled to an input of the operational amplifier circuit, a first input of the summing input circuit being coupled to the temperature compensation circuit and a second input of the summing input circuit being coupled to the process compensation circuit.

41. The programmable logic device of claim 40, wherein the compensation circuit further comprises:
   an interface circuit coupled to the compensation conversion circuit to receive the bias signal as an input and to provide as an output at least one bias signal.

42. The programmable logic device of claim 41, wherein the at least one bias signal provided by the interface circuit includes at least two bias signals including a PMOS bias signal and an NMOS bias signal.

43. The programmable logic device of claim 40, wherein the temperature compensation circuit comprises:
   a current source coupled to a voltage source and a temperature compensation node; and
   a resistor coupled to a voltage sink and the temperature compensation node, the temperature compensation node being coupled to an input of the compensation conversion circuit.

44. A compensation circuit comprising:
   a temperature compensation circuit which provides as an output a temperature compensation signal indicative of temperature variations;
   a process compensation circuit which provides as an output a process compensation signal indicative of process variations;
   a supply compensation circuit which provides as an output a supply compensation signal indicative of supply voltage variations; and
   a compensation conversion circuit coupled to the temperature compensation circuit, the process compensation circuit, and the supply compensation circuit to provide as an output a bias signal from the temperature compensation signal and the supply compensation signal, wherein
   the compensation conversion circuit comprises an operational amplifier circuit and a summing input circuit coupled to a first input of the operational amplifier circuit, a first input of the summing input circuit being coupled to the temperature compensation circuit, a second input of the summing input circuit being coupled to the process compensation circuit, and a second input of the operational amplifier circuit being coupled to the supply compensation circuit.

45. The compensation circuit of claim 44 further comprising:
   an interface circuit coupled to the compensation conversion circuit to receive the bias signal as in input and to provide as an output at least one bias signal.

46. The compensation circuit of claim 45 wherein the at least one bias signal provided by the interface circuit includes at least two bias signals including a PMOS bias signal and an NMOS bias signal.

47. The compensation circuit of claim 45 wherein the interface circuit connects to a current mirror circuit.

48. The compensation circuit of claim 44 wherein the temperature compensation circuit comprises:
   a current source coupled to a voltage source and a temperature compensation node; and
   a resistor coupled to a voltage sink and the temperature compensation node, the temperature compensation node being coupled to an input of the compensation conversion circuit.

49. The compensation circuit of claim 48 wherein the current source is a proportional to ambient temperature (PTAT) current source.

50. The compensation circuit of claim 48 wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the compensation conversion circuit and the temperature compensation node being coupled to a second input of the compensation conversion circuit.

51. The compensation circuit of claim 50 wherein the compensation conversion circuit comprises an operational amplifier circuit having a first input and a second input;
the supply compensation node being coupled to the first input and the temperature compensation node being coupled to the second input.

52. The compensation circuit of claim 51 wherein the first input is an inverting input and the second input is a non-inverting input.

53. The compensation circuit of claim 44 wherein the process compensation circuit comprises:
a current source coupled to a voltage source and a process compensation node; and
a diode circuit comprising at least one gate-to-drain-coupled transistor of a transistor type or types corresponding to transistors in a circuit for which the compensation circuit is compensating, the diode circuit being coupled to a voltage sink and to the process compensation node, the process compensation node being coupled to an input of the compensation conversion circuit.

54. The compensation circuit of claim 53 wherein the at least one gate-to-drain-coupled transistor of the process compensation circuit includes CMOS transistors including a PMOS transistor and an NMOS transistor.

55. The compensation circuit of claim 53 wherein the current source is a proportional to ambient temperature (PTAT) current source.

56. The compensation circuit of claim 44 wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to an input of the compensation conversion circuit.

57. A compensation circuit comprising:
a temperature compensation circuit which provides as an output a temperature compensation signal indicative of temperature variations;
a process compensation circuit which provides as an output a process compensation signal indicative of process variations;
a supply compensation circuit which provides as an output a supply compensation signal indicative of supply voltage variations; and
a compensation conversion circuit coupled to the temperature compensation circuit, the process compensation circuit, and the supply compensation circuit to provide as an output a bias signal from the temperature compensation signal and the supply compensation signal, wherein
the temperature compensation circuit comprises: a current source coupled to a voltage source and a temperature compensation node; and a resistor coupled to a voltage sink and the temperature compensation node, the temperature compensation node being coupled to an input of the compensation conversion circuit;
the process compensation circuit comprises: a current source coupled to a voltage source and a process compensation node; and a diode circuit comprising at least one gate-to-drain-coupled transistor of a transistor type or types corresponding to transistors in a circuit for which the compensation circuit is compensating, the diode current being coupled to a voltage sink and to the process compensation node; and
the compensation conversion circuit comprises an operational amplifier circuit and a summing input circuit coupled to an input of the operational amplifier circuit, a first input of the summing input circuit being coupled to the temperature compensation node and a second input of the summing input circuit being coupled to the process compensation node.

58. The compensation circuit of claim 57 wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the operational amplifier circuit, and the summing input circuit being coupled to a second input of the operational amplifier circuit.

59. A programmable logic device including a compensation circuit, the compensation circuit comprising:
a temperature compensation circuit which provides as an output a temperature compensation signal indicative of temperature variations;
a process compensation circuit which provides as an output a process compensation signal indicative of process variations;
a supply compensation circuit which provides as an output a supply compensation signal indicative of supply voltage variations; and
a compensation conversion circuit coupled to the temperature compensation circuit, the process compensation circuit, and the supply compensation circuit to provide as an output a bias signal from the temperature compensation signal and the supply compensation signal, wherein
the compensation conversion circuit comprises an operational amplifier circuit and a summing input circuit coupled to a first input of the operational amplifier circuit, a first input of the summing input circuit being coupled to the temperature compensation circuit, a second input of the summing input circuit being coupled to the process compensation circuit, and a second input of the operational amplifier circuit being coupled to the supply compensation circuit.

60. The programmable logic device of claim 59, wherein the compensation circuit further comprises:
an interface circuit coupled to the compensation conversion circuit to receive the bias signal as in input and to provide as an output at least one bias signal.

61. The programmable logic device of claim 60, wherein the at least one bias signal provided by the interface circuit includes at least two bias signals including a PMOS bias signal and an NMOS bias signal.

62. The programmable logic device of claim 60, wherein the interface circuit connects to a current mirror circuit.

63. A programmable logic device including a compensation circuit, the compensation circuit comprising:
a temperature compensation circuit which provides as an output a temperature compensation signal indicative of temperature variations;
a process compensation circuit which provides as an output a process compensation signal indicative of process variations;

a supply compensation circuit which provides as an output a supply compensation signal indicative of supply voltage variations; and a compensation conversion circuit coupled to the temperature compensation circuit, the process compensation circuit, and the supply compensation circuit to provide as an output a bias signal from the temperature compensation signal and the supply compensation signal, wherein the temperature compensation circuit comprises a current source coupled to a voltage source and a temperature compensation node, and a resistor coupled to a voltage sink and the temperature compensation node, the temperature compensation node being coupled to an input of the compensation conversion circuit;

the process compensation circuit comprises a current source coupled to a voltage source and a process compensation node, and a diode circuit comprising at least one gate-to-drain-coupled transistor of a transistor type or types corresponding to transistors in a circuit for which the compensation circuit is compensating, the diode circuit being coupled to a voltage sink and to the process compensation node; and the compensation conversion circuit comprises an operational amplifier circuit and a summing input circuit coupled to an input of the operational amplifier circuit, a first input of the summing input circuit being coupled to the temperature compensation node and a second input of the summing input circuit being coupled to the process compensation node.

64. The programmable logic device of claim 63, wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the operational amplifier circuit, and the summing input circuit being coupled to a second input of the operational amplifier circuit.

65. A compensation circuit comprising:
a temperature compensation circuit which provides as an output a temperature compensation signal indicative of temperature variations;
a process compensation circuit which provides as an output a process compensation signal indicative of process variations;
a supply compensation circuit which provides as an output a supply compensation signal indicative of supply voltage variations; and
a compensation conversion circuit coupled to the temperature compensation circuit, the process compensation circuit, and the supply compensation circuit to provide as an output a bias signal from the temperature compensation signal and the supply compensation signal, wherein
the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to an input of the compensation conversion circuit.

66. The compensation circuit of claim 65 further comprising:

an interface circuit coupled to the compensation conversion circuit to receive the bias signal as an input and to provide as an output at least one bias signal.

67. The compensation circuit of claim 66 wherein the at least one bias signal provided by the interface circuit includes at least two bias signals including a PMOS bias signal and an NMOS bias signal.

68. The compensation circuit of claim 66 wherein the interface circuit connects to a current mirror circuit.

69. The compensation circuit of claim 65 wherein the temperature compensation circuit comprises:
a current source coupled to a voltage source and a temperature compensation node; and
a resistor coupled to a voltage sink and the temperature compensation node, the temperature compensation node being coupled to an input of the compensation conversion circuit.

70. The compensation circuit of claim 69 wherein the current source is a proportional to ambient temperature (PTAT) current source.

71. The compensation circuit of claim 69 wherein the process compensation circuit comprises:
a current source coupled to a voltage source and a process compensation node; and
a diode circuit comprising at least one gate-to-drain-coupled transistor of a transistor type or types corresponding to transistors in a circuit for which the compensation circuit is compensating, the diode circuit being coupled to a voltage sink and to the process compensation node;
and wherein the compensation conversion circuit comprises an operational amplifier circuit and a summing input circuit coupled to an input of the operational amplifier circuit, a first input of the summing input circuit being coupled to the temperature compensation node and a second input of the summing input circuit being coupled to the process compensation node.

72. The compensation circuit of claim 71 wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to a first input of the operational amplifier circuit, and the summing input circuit being coupled to a second input of the operational amplifier circuit.

73. The compensation circuit of claim 64 wherein the temperature compensation node couples to a second input of the compensation conversion circuit.

74. The compensation circuit of claim 73 wherein the compensation conversion circuit comprises an operational amplifier circuit having a first input and a second input;
the supply compensation node being coupled to the first and the temperature compensation node being coupled to the second input.

75. The compensation circuit of claim 74 wherein the first input is an inverting and the second input is a non-inverting input.

76. The compensation circuit of claim 65 wherein the process compensation circuit comprises:
a current source coupled to a voltage source and a process compensation node; and
a diode circuit comprising at least one gate-to-drain-coupled transistor of a transistor type or types corresponding to transistors in a circuit for which the compensation circuit is compensating, the diode circuit being coupled to a voltage sink and to the process compensation node, the process compensation node being coupled to an input of the compensation conversion circuit.

77. The compensation circuit of claim 76 wherein the at least one gate-to-drain-coupled transistor of the process compensation circuit includes CMOS transistors including a PMOS transistor and an NMOS transistor.

78. The compensation circuit of claim 76 wherein the current source is a proportional to ambient temperature (PTAT) current source.

79. A programmable logic device including a compensation circuit, the compensation circuit comprising:

a temperature compensation circuit which provides as an output a temperature compensation signal indicative of temperature variations;

a process compensation circuit which provides as an output a process compensation signal indicative of process variations;

a supply compensation circuit which provides as an output a supply compensation signal indicative of supply voltage variations; and a compensation conversion circuit coupled to the temperature compensation circuit, the process compensation circuit, and the supply compensation circuit to provide as an output a bias signal from the temperature compensation signal and the supply compensation signal, wherein the supply compensation circuit comprises a voltage divider circuit coupled to a supply compensation node, to a source voltage, and to a sink voltage, the source voltage providing a supply voltage, the supply compensation signal being indicative of variations in the supply voltage, the supply compensation node being coupled to an input of the compensation conversion circuit.

80. The programmable logic device of claim 79, wherein the compensation circuit further comprises:

an interface circuit coupled to the compensation conversion circuit to receive the bias signal as in input and to provide as an output at least one bias signal.

81. The programmable logic device of claim 79, wherein the temperature compensation circuit comprises:

a current source coupled to a voltage source and a temperature compensation node; and a resistor coupled to a voltage sink and the temperature compensation node, the temperature compensation node being coupled to an input of the compensation conversion circuit.

82. The programmable logic device of claim 81, wherein the compensation conversion circuit comprises an operational amplifier circuit having a first input and a second input;

the supply compensation node being coupled to the first input and the temperature compensation node being coupled to the second input.

83. The programmable logic device of claim 79, wherein the process compensation circuit comprises:

a current source coupled to a voltage source and a process compensation node; and a diode circuit comprising at least one gate-to-drain-coupled transistor of a transistor type or types corresponding to transistors in a circuit for which the compensation circuit is compensating, the diode circuit being coupled to a voltage sink and to the process compensation node, the process compensation node being coupled to an input of the compensation conversion circuit.

* * * * *